US011381053B2

(12) United States Patent
Bian et al.

(10) Patent No.: US 11,381,053 B2
(45) Date of Patent: Jul. 5, 2022

(54) WAVEGUIDE-CONFINING LAYER WITH GAIN MEDIUM TO EMIT SUBWAVELENGTH LASERS, AND METHOD TO FORM SAME

(71) Applicant: GLOBALFOUNDRIES U.S. Inc., Santa Clara, CA (US)

(72) Inventors: Yusheng Bian, Ballston Lake, NY (US); Ajey Poovannummoottil Jacob, Watervliet, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 184 days.

(21) Appl. No.: 16/718,329

(22) Filed: Dec. 18, 2019

(65) Prior Publication Data
US 2021/0194201 A1    Jun. 24, 2021

(51) Int. Cl.
*H01S 3/063*    (2006.01)
*H01S 3/16*    (2006.01)
*H01S 3/091*    (2006.01)

(52) U.S. Cl.
CPC .......... *H01S 3/0637* (2013.01); *H01S 3/1608* (2013.01); *H01S 3/1636* (2013.01); *H01S 3/091* (2013.01)

(58) Field of Classification Search
CPC ................... H01S 3/1636; H01S 3/091; H01S 3/063–0637; G02B 2006/121; G02B 2006/12097; G02B 2006/12061
See application file for complete search history.

(56) References Cited

U.S. PATENT DOCUMENTS

| 4,697,868 A | 10/1987 | Thanivavarn |
| 6,031,858 A | 2/2000 | Hatakoshi et al. |

(Continued)

FOREIGN PATENT DOCUMENTS

| CN | 109346910 A | * | 2/2019 | ......... H01S 3/08054 |
| EP | 0323317 B1 | * | 7/1992 | ............. G02B 6/136 |

(Continued)

OTHER PUBLICATIONS

Sze, "Physics of Semiconductor Devices", 2007, John Wiley & Sons, Inc., 3rd Ed., 343. (Year: 2007).*

(Continued)

*Primary Examiner* — Joshua King
(74) *Attorney, Agent, or Firm* — Francois Pagette; Hoffman Warnick LLC

(57) ABSTRACT

Embodiments of the disclosure provide a waveguide-confining layer, a photonic integrated circuit (PIC) die with embodiments of a waveguide-confining layer, and methods to form the same. The waveguide-confining layer may include an oxide layer over a buried insulator layer, a silicon-based optical confinement structure embedded within or positioned on the oxide layer, and first and second blocking layers over the oxide layer and separated from each other by a horizontal slot. The first and second blocking layers include a metal or an oxide. A gain medium is positioned on the oxide layer and within the horizontal slot between the first and second blocking layers, and has a lower refractive index than each of the first and second blocking layers. The gain medium is vertically aligned with the silicon-based optical confinement structure, and a portion of the oxide layer separates the gain medium from the silicon-based optical confinement structure.

10 Claims, 15 Drawing Sheets

(56) References Cited

U.S. PATENT DOCUMENTS

| | | | | |
|---|---|---|---|---|
| 6,160,824 | A * | 12/2000 | Meissner | H01S 3/0632 372/10 |
| 6,330,388 | B1 * | 12/2001 | Bendett | C03C 4/00 385/132 |
| 6,891,983 | B2 | 5/2005 | Hammer | |
| 7,142,759 | B2 * | 11/2006 | Heideman | G02B 6/122 385/129 |
| 7,528,403 | B1 * | 5/2009 | Borselli | G02B 6/12004 257/101 |
| 7,787,509 | B2 | 8/2010 | Ukai et al. | |
| 8,891,913 | B1 * | 11/2014 | Roth | G02B 6/132 385/14 |
| 9,470,844 | B1 | 10/2016 | Ma et al. | |
| 9,547,622 | B1 * | 1/2017 | Nagarajan | G06F 13/4282 |
| 10,031,286 | B1 * | 7/2018 | Li | H01S 3/0632 |
| 10,132,997 | B2 * | 11/2018 | Mahgerefteh | G02B 6/2726 |
| 10,191,215 | B2 * | 1/2019 | Kippenberg | H01P 3/16 |
| 10,215,920 | B2 | 2/2019 | Ma et al. | |
| 10,241,267 | B2 * | 3/2019 | Kiyota | G02B 6/12004 |
| 10,317,632 | B2 * | 6/2019 | Mahgerefteh | G02B 6/4214 |
| 10,461,489 | B2 * | 10/2019 | Purnawirman | H01S 3/0632 |
| 10,468,849 | B1 * | 11/2019 | Bradley | H01S 3/0637 |
| 10,483,716 | B2 * | 11/2019 | Menezo | H01S 5/1237 |
| 10,715,887 | B2 * | 7/2020 | Seok | H04Q 11/0005 |
| 10,797,462 | B1 * | 10/2020 | Doerr | H01S 3/1608 |
| 10,809,456 | B2 * | 10/2020 | Lee | G02B 6/1225 |
| 10,826,267 | B2 * | 11/2020 | Mahgerefteh | G02B 6/12004 |
| 11,088,503 | B2 * | 8/2021 | Bian | H01S 3/063 |
| 11,114,815 | B1 * | 9/2021 | Chen | H01S 3/0637 |
| 2002/0048289 | A1 * | 4/2002 | Atanackovic | B82Y 20/00 372/20 |
| 2002/0085270 | A1 * | 7/2002 | Bendett | H01S 3/063 359/343 |
| 2003/0003736 | A1 * | 1/2003 | Delwala | G02B 6/1225 438/689 |
| 2003/0059190 | A1 * | 3/2003 | Gunn, III | G02B 6/136 385/130 |
| 2004/0183087 | A1 * | 9/2004 | Gardner | B82Y 20/00 257/102 |
| 2004/0213539 | A1 * | 10/2004 | Anderson | C03C 3/062 385/142 |
| 2005/0008051 | A1 * | 1/2005 | Sumida | H01S 3/0606 372/39 |
| 2005/0141078 | A1 * | 6/2005 | Jung | H01S 3/0632 359/333 |
| 2006/0098928 | A1 * | 5/2006 | Koch | G02B 6/132 385/129 |
| 2006/0268395 | A1 * | 11/2006 | Steckl | H01S 3/0632 359/341.1 |
| 2007/0069332 | A1 * | 3/2007 | Negro | G02B 6/12004 257/530 |
| 2007/0114628 | A1 * | 5/2007 | Barrios | H01S 3/083 257/432 |
| 2008/0137695 | A1 * | 6/2008 | Takahashi | G02B 6/1228 372/19 |
| 2008/0181279 | A1 * | 7/2008 | Burgi | H01L 51/5271 372/108 |
| 2008/0267237 | A1 * | 10/2008 | Hall | H01L 21/31666 372/45.01 |
| 2008/0285610 | A1 * | 11/2008 | Hall | H01L 21/31155 372/45.011 |
| 2011/0122485 | A1 * | 5/2011 | Castagna | H01S 3/0632 359/344 |
| 2012/0033294 | A1 * | 2/2012 | Beausoleil | H01S 3/0632 359/341.3 |
| 2013/0272646 | A1 * | 10/2013 | Fish | G02B 6/305 385/14 |
| 2014/0269800 | A1 * | 9/2014 | Purnawirman | H01S 3/1636 372/40 |
| 2016/0131842 | A1 * | 5/2016 | Mahgerefteh | G02B 6/1223 385/11 |
| 2016/0156147 | A1 * | 6/2016 | Raino | G02B 6/1228 359/341.3 |
| 2017/0141536 | A1 * | 5/2017 | Fang | H01S 5/02453 |
| 2018/0241176 | A1 * | 8/2018 | Abel | H01S 3/0637 |
| 2018/0269653 | A1 * | 9/2018 | Shtyrkova | H01S 5/0657 |
| 2019/0391328 | A1 * | 12/2019 | Li | G02B 6/4214 |

FOREIGN PATENT DOCUMENTS

| | | | | |
|---|---|---|---|---|
| EP | 1182474 | A2 * | 2/2002 | G02B 6/132 |
| EP | 2081063 | A1 * | 7/2009 | G02B 6/1223 |
| JP | H07106671 | A * | 4/1995 | H01S 3/094 |
| WO | 2008117249 | A1 | 10/2008 | |
| WO | WO-2008117249 | A1 * | 10/2008 | H01S 3/063 |
| WO | WO-2013168587 | A1 * | 11/2013 | H01S 3/067 |
| WO | WO-2017032754 | A1 * | 3/2017 | G02B 6/131 |
| WO | WO-2020127812 | A1 * | 6/2020 | G02B 6/136 |

OTHER PUBLICATIONS

Belt et al., "Arrayed narrow linewidth erbium-doped waveguide-distributed feedback lasers on an ultra-low-loss silicon-nitride platform," Optics Letters, vol. 38, No. 22, Nov. 15, 2013, 4825-1828.

Bian et al., "Hybrid vanadate waveguiding configurations for extreme optical confinement and efficient polarization management in the near-infrared," The Royal Society of Chemistry, Nanoscale 2018, 10, 16667-16674.

Dai et al., "Compact broadband polarizer based on shallowly-etched silicon-on-insulator ridge optical waveguides," Optics Express, vol. 18, No. 26, Dec. 20, 2010, 27404-27415.

De Oliveira et al., "Graphene Based Waveguide Polarizers: In-Depth Physical Analysis and Relevant Parameters," Scientific Reports, 5:16949, Nov. 19, 2015.

Edwards et al., "Experimental Verification of Epsilon-Near-Zero Metamaterial Coupling and Energy Squeezing Using a Microwave Waveguide," Physical Review Letters, 100:033903, 2008.

Huang et al., "CMOS compatible horizontal nanoplasmonic slot waveguides TE-pass polarizer on silicon-on-insulator platform," Optics Express, vol. 21, No. 10, May 20, 2013, 12790-12796.

Liberal et al., "Near-zero refractive index photonics," Nature Photonics, 11:149-58, Mar. 2017.

Maas et al., "Experimental realization of an epsilon-near-zero metamaterial at visible wavelengths," Nature Photonics, published online Oct. 13, 2013.

Polman, Energy transfer in erbium doped optical waveguides based on silicon, ISBN 90-393-2491-3.

Saini et al., "Analysis of Silicon Clad Optical Waveguide for High Extinction Ratio TE/TM Pass Polarizers using Resonant Coupling between Guided Modes and Lossy Modes," IOSR Journal of Electiical and Electronics Engineering, 12:59-64, May-Jun. 2017.

Selvaraja et al., "Review on Optical Waveguides: Emerging Waveguide Technology," Chapter 6, 2018, 95-129.

Sun et al., "Experimental demonstration of a hybrid plasmonic transverse electric pass polarizer for a silicon-on-insulator platform," Optics Letters, vol. 37, No. 23, Dec. 1, 2012, 4814-4816.

Sun et al., "Horizontal single and multiple slot waveguides: optical transmission at λ = 1550 nm," Optics Express, vol. 15, No. 26, Dec. 24, 2007, 17967-17972.

Syms et al., Optical Guided Waves and Devices, Chapter 9, Channel Waveguide Integrated Optics, 32 pages.

U.S. Appl. No. 16/291,346, filed Mar. 4, 2019, entitled "Polarizers and Polarization Splitters Phase-Matched with a Back-End-of-Line Layer.".

Maes et al., "3.4 W Monolithic Erbium-Doped All-Fiber Laser at 3.55 µm," Centre d'Optique, Photonique et Lasers, Université Laval, 2375 rue de la Terrasse, Quebec, QC, Canada, Crown, 2017, 1 page.

Giewont et al., "300-mm Monolithic Silicon Photonics Foundry Technology," IEEE Journal of Selected Topics in Quantum Electronics, vol. 25, No. 5, Sep./Oct. 2019, 12 pages.

Purnawirman et al., "C- and L-band erbium-doped waveguide lasers with wafer-scale silicon nitride cavities," Optics Letters, vol. 38, No. 11, Jun. 1, 2013, 3 pages.

(56) References Cited

OTHER PUBLICATIONS

Belt et al., "Erbium-doped waveguide DBR and DFB laser arrays integrated within an ultra-low-loss $Si_2N_4$ platform," May 5, 2014, vol. 22, No. 9, Optics Express 10655, 6 pages.
Peled et al., "Monolithic rare-earth doped sol-gel tapered rib waveguide laser," Applied Physics Letters 92, 221104 (2008), 3 pages.
Oulton et al., "Plasmon lasers at deep subwavelength scale," Nature: Letters, vol. 461, Oct. 1, 2009, doi: 10.1038/nature 08364, 4 pages.
Lu et al., "Plasmonic Nanolaser Using Epitaxially Grown Silver Film," Science, vol. 337, Jul. 27, 2012, 5 pages.
Anonymous, Nature: Supplementary Information, doi: 10.1038/nature 08364, 4 pages.
Purnawirman et al., "Ultra-narrow-linewidth $Al_2O_3$:$ER^{3+}$ lasers with a wavelength-insensitive waveguide design on a wafer-scale silicon nitride platform," Research Article, Optics Express 13706, vol. 25, No. 12, Jun. 12, 2017, 9 pages.

\* cited by examiner

WAVEGUIDE-CONFINING LAYER WITH GAIN MEDIUM TO EMIT SUBWAVELENGTH LASERS, AND METHOD TO FORM SAME

TECHNICAL FIELD

Embodiments of the disclosure relate generally to a waveguide-confining layer for a photonic integrated circuit (PIC) die and methods to form the same. More specifically, the disclosure relates to a waveguide-confining layer with at least two blocking layers arranged to create a horizontal slot therebetween, and a silicon-based optical confinement structure vertically aligned with the slot.

BACKGROUND

The rise of networking devices, such as the "Internet of Things" (IoT), with links to a data center has accompanied a larger number of signal-processing elements in semiconductor wafers. Semiconductor chips may be modified, adapted, etc., to house the various components needed to transmit light from one component to another. Semiconductor chips which include photonic devices and microcircuitry are known as "photonic integrated circuits" (PICs). PIC dies typically include optical components on the surface or at the edge of a PIC die to transmit light into and from the optical devices therein such as waveguides and grating couplers. The various optical components, e.g., photonic waveguides, photonic transmitters and receivers, etc., can relay signals through light transmission.

A technical challenge associated with PIC technology is the building of laser emitters which will be operable for use with ultra-thin (i.e., substantially two-dimensional) materials or similar materials. In these operating settings, it is often preferable to transmit laser beams with a diameter that is less than the wavelength of the light produced. Laser beams of this size are known in the art as "sub-wavelength" lasers. Conventional approaches for generating laser beams of this size typically require multiple device layers, e.g., due to the limited of confinement offered by conventional gain media with low refractive indices. Thus, laser emitters capable of emitting a sub-wavelength laser are difficult or impossible to integrate with electronics that are formed on a smaller scale. More specifically, conventional sub-wavelength laser emitters occupy substantial surface area and volume on a device, further limiting the available space for other device components.

SUMMARY

Aspects of the present disclosure provide a waveguide-confining layer for a photonic integrated circuit (PIC) die, the waveguide-confining layer including: an oxide layer over a buried insulator layer; a silicon-based optical confinement structure embedded within or positioned on the oxide layer; a first blocking layer and a second blocking layer over the oxide layer and separated from each other by a horizontal slot, wherein each of the first blocking layer and the second blocking layer includes a metal or an oxide; and a gain medium on the oxide layer and within the horizontal slot between the first blocking layer and the second blocking layer, the gain medium including a material having a lower refractive index than each of the first blocking layer and the second blocking layer, wherein the gain medium is vertically aligned with the silicon-based optical confinement structure, and a portion of the oxide layer separates the gain medium from the silicon-based optical confinement structure.

Further aspects of the present disclosure provide a photonic integrated circuit (PIC) die including: a semiconductor substrate; a buried insulator layer on the semiconductor substrate; an oxide layer over the buried insulator layer; a silicon-based optical confinement structure embedded within or positioned on the oxide layer; first blocking layer and the second blocking layer over the oxide layer and separated from each other and separated by a horizontal slot, wherein each of the first blocking layer and the second blocking layer includes a metal or an oxide; a gain medium on the oxide layer and within the horizontal slot between the first blocking layer and the second blocking layer, the gain medium including a material having a lower refractive index than each of the first blocking layer and the second blocking layer, wherein the gain medium is vertically aligned with the silicon-based optical confinement structure, and a portion of the oxide layer separates the gain medium from the silicon-based optical confinement structure; a waveguide optically coupled to the gain medium; and a back-end-of-line (BEOL) stack over the gain medium and the first blocking layer and the second blocking layer, wherein the BEOL stack includes a light source in optical alignment with the gain medium.

Yet another aspect of the present disclosure provides a method of forming a photonic integrated circuit (PIC) die, the method including: forming a silicon-based optical confinement structure over a buried insulator layer, the buried insulator layer being positioned on a semiconductor substrate; forming an oxide layer on the silicon-based optical confinement structure and the buried insulator layer, such that the oxide layer contacts an upper surface and sidewalls of the silicon-based optical confinement structure; forming a blocking layer over the oxide layer; forming a horizontal slot within the blocking layer by removing a portion of the blocking layer in vertical alignment with the silicon-based optical confinement structure, wherein forming the horizontal slot converts the blocking layer into a first blocking layer and a second blocking layer separated from each other by the horizontal slot; and forming a gain medium over the oxide layer within the horizontal slot between the first blocking layer and the second blocking layer.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
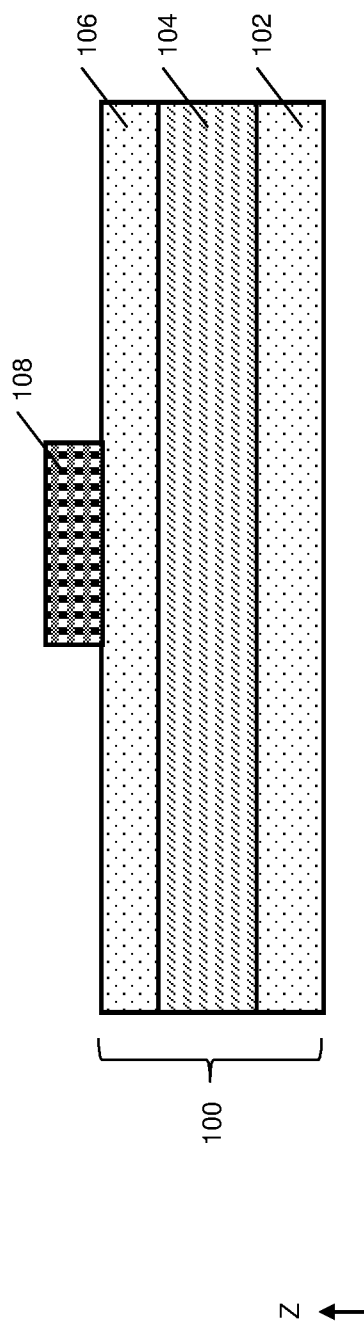
FIG. 1 shows a cross-sectional view of a process to form a precursor confinement structure over a buried insulator layer according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

The present disclosure relates to integrated circuit (PIC) dies with a waveguide-confining layer for producing sub-wavelength sized lasers, and methods to form the PIC dies. PIC dies may include semiconductor wafers structured to include electrical components (e.g., wires, vias, transistors, and other devices) as well as photonic elements (e.g., an optical waveguide, photodiode, etc.) for transmitting and/or processing photonic signals. In some applications, it may be desirable to transmit photonic signals using lasers that have a light radius smaller than the wavelength of the light being transmitted.

The disclosure overcomes technical limitations in conventional PIC die structures through a waveguide-confining layer that may be easily integrated into other portions of a PIC die structure, while being operable to transmit photonic signals using sub-wavelength laser beams. The term "waveguide-confining," as used herein, refers to a layer structured to limit the size of laser beams produced from a laser gain medium using any suitable process for light generation, e.g., optical pumping. By limiting the radius of light output from the gain medium, the size of a waveguide for transmitting light from the gain medium may also be reduced. Various embodiments of the disclosure are suitable to produce sub-wavelength beams using an optically pumped laser. An optically pumped laser refers to an instrument in which a light source is used to raise (or "pump") electrons of a material from a lower energy level in an atom or molecule to a higher one. The light energy is thus absorbed in the material, known in the art as a "gain medium," and causes at least some of the materials to enter the excited state. The excited atoms may emit light as a result of the absorbed energy, and thus the gain medium can act as a laser or an optical amplifier.

In embodiments of the disclosure, a waveguide-confining layer may include a first blocking layer and a second blocking layer separated by a horizontal slot, with a gain medium (e.g., an oxide doped with a rare-earth metal) within the horizontal slot between the first blocking layer and the second blocking layer. The first blocking layer and the second blocking layer may be formed of a metal or other substance with a higher refractive index than the gain medium. A silicon-based optical confinement structure, also formed of a refractive material, may be vertically aligned with the gain medium to confine emitted light for transference to an optical waveguide. In this configuration, light entering the gain medium from a vertically aligned light source will be refracted, and thus constrained by, the blocking layers before light output from the gain medium passes to the silicon-based confinement layer. The structure of the waveguide-confining layer will cause the emitted laser to have a diameter that is less than its wavelength. During operation, embodiments of the disclosure may output lasers having a mode diameter size of, e.g., approximately three-hundred nanometers (nm).

Referring initially to FIG. 1, embodiments of the disclosure provide a method to form a waveguide-confining layer and PIC die. An initial structure 100 to be processed according to the disclosure may include materials that are also used to form portions of a device layer, e.g., several transistors, elsewhere on the same device. Initial structure 100 may include a substrate 102 at least partially composed of any currently known or later developed semiconductor material, which may include without limitation: silicon, germanium, silicon germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances may include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

A buried insulator layer 104, also known in the art as a "buried oxide" or "BOX" layer, can separate substrate 102 from overlying portions of the PIC die structure, e.g., a precursor silicon-based optical confinement structure ("precursor confinement structure" hereafter) 106. Buried insulator layer 104 may be composed of one or more oxide compounds, and/or any other currently known or later-developed electrically insulative substances. As examples, buried insulator layer 104 may include materials such as: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), near frictionless carbon (NFC), a spin-on silicon-carbon containing polymer material available from JSR Corporation, other low dielectric constant (<3.9) material, or layers thereof.

Precursor confinement structure 106 may be formed as a single layer of material on buried insulator 104. Precursor confinement structure 106 may include any currently known or later developed material having a high refractive index (e.g., greater than 1.50). Such materials may include crystalline silicon (including, e.g., single-crystal silicon and/or polycrystalline silicon), silicon nitride (SiN) and/or other refractive materials formed at least partially of silicon and/or silicon-based materials. Precursor confinement structure 106 may be formed on buried insulator layer 104, e.g., by deposition. Deposition, or "depositing," may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, and/or other techniques to form a material.

In the eventual structure of a PIC die, the confinement effects of precursor confinement structure 106 may be enhanced by decreasing its horizontal size over buried insulator layer 104. Embodiments of the disclosure may include forming a first mask 108 on selected portions of precursor confinement structure 106. First mask 108 may take the form of a layer of protective material which is applied over selected portions of the underlying precursor confinement structure 106. First mask 108 may be patterned to have openings, so that the underlying precursor confinement structure 106 can be processed (i.e., removed or protected) where there are openings. In the example of FIG. 1, portions of precursor confinement structure 106 not covered by first mask 108 are targeted for removal. After the processing of precursor confinement structure 106, first mask 108 may be removed. Common materials suitable form first mask 108 may include one or more photoresist layers, such as nitride. Nitride-based layers in particular are usually considered to be a "hard mask."

Figure 2:
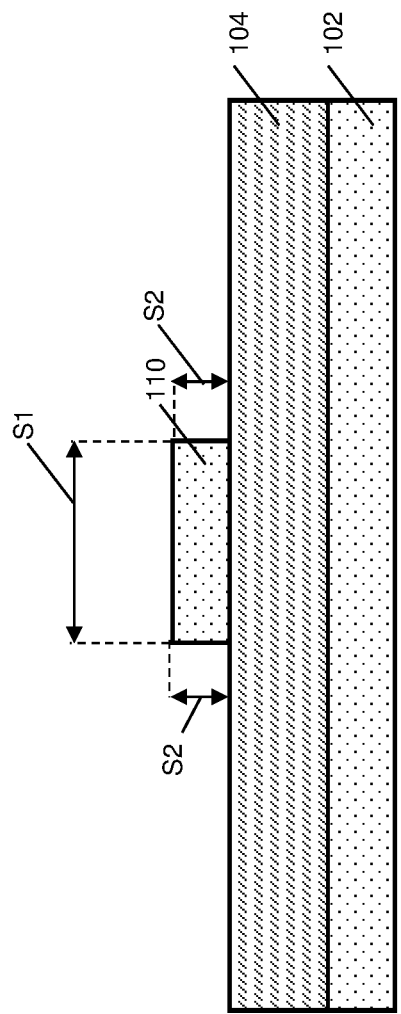
FIG. 2 shows a cross-sectional view of a process to form a silicon-based optical confinement structure according to embodiments of the disclosure.

Turning to FIG. 2, portions of precursor confinement structure 106 (FIG. 1) may be removed to yield a silicon-based optical confinement structure (simply "confinement structure" hereafter) 110. Various portions of precursor confinement structure 106 may be removed by etching. Etching generally refers to the removal of material from an underlying layer, e.g., buried insulator layer 104 or others discussed herein, and is often performed with a mask in place so that material may selectively be removed from certain areas, while leaving the material unaffected, in other areas. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features. In the example of FIG. 2, the remaining confinement structure 110 may have an upper surface S1 of a predetermined size, e.g., based on the size of first mask 108 (FIG. 1). Additionally, confinement structure 110 may include sidewalls S2 at its opposing horizontal ends.

Figure 3:
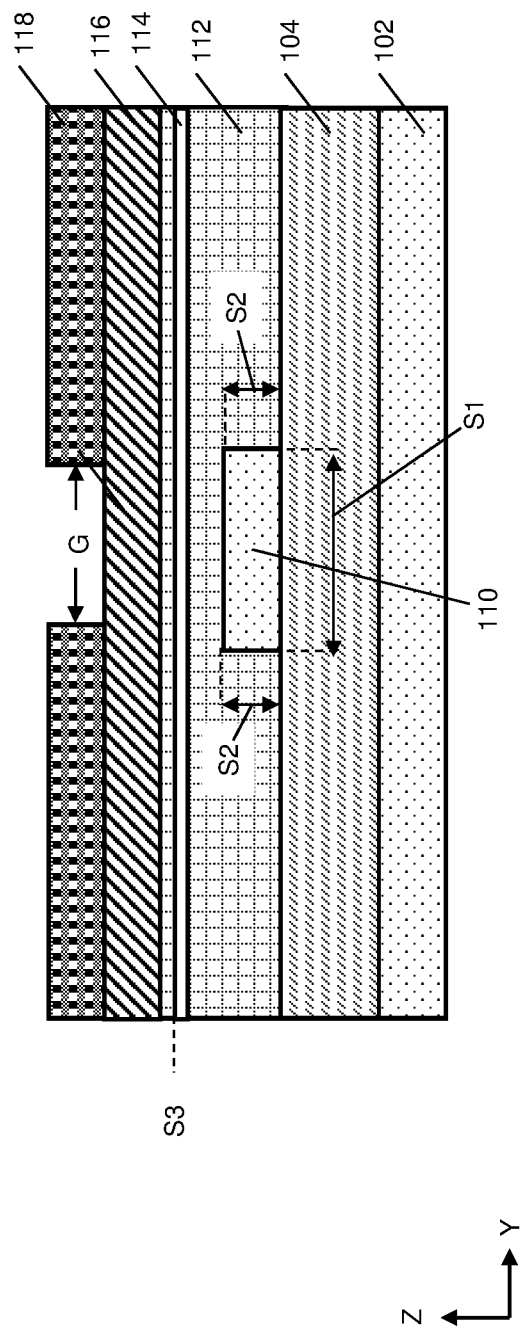
FIG. 3 shows a cross-sectional view of a process to form an oxide layer, blocking layer, and mask layer according to embodiments of the disclosure.

Continuing to FIG. 3, embodiments of the disclosure may include forming various additional layers to cover buried insulator layer 104 and confinement structure 110. After confinement structure 110 is formed, continued processing may include forming an oxide layer 112 on confinement structure 110 and buried insulator 104. Oxide layer 112 may include one or more oxide-based insulating materials with a low refractive index, e.g., any of those discussed elsewhere herein regarding buried insulator layer 104. Oxide layer 112 may cover upper surface S1 and sidewalls S2 of confinement structure 110. Unlike confinement structure 110, oxide layer 112 may be formed of a material having a low refractive index (e.g., a refractive index of less than 1.50) such that light may travel through oxide layer 112 while being substantially unimpeded. Oxide layer 112 may cover upper surface S1 and sidewalls S2 of confinement structure 110, and thus may have an upper surface S3 located above each of buried insulator layer 104 and confinement structure 110. To further confine light in the horizontal direction, embodiments of the disclosure can optionally include forming a nitride layer 114 on or within oxide layer 112. Nitride layer 114 may include silicon nitride (SiN) and/or other materials for further focusing of light toward the location of confinement structure 110. Where included, nitride layer 114 may help to reduce the size of emitted lasers in the horizontal direction, and in the case of SiN, the silicon component of nitride layer 114 may further increase the field confinement within a subsequently formed gain medium.

Regardless of whether nitride layer 114 is formed, further processing may include forming various materials for producing lasers by optical pumping, and for enhancing light confinement within a gain medium. Conventional light confinement structures typically include a unitary layer of the gain medium material, with any light-refracting or confining materials being positioned above the gain medium itself. By contrast, embodiments of the disclosure are operable to provide multiple confining structures within a same layer, or directly beneath the gain medium material. In some cases, embodiments of the disclosure may feature light-confining materials positioned within a vertical area having the same vertical thickness as a transistor layer of the PIC die. Continued processing may include forming a precursor blocking layer 116 over oxide layer 112, and/or nitride layer 114 where applicable. Precursor blocking layer 116 may be composed of any material having a high refractive index (i.e., 1.5 or greater), and thus capable of blocking the vertical passage of emitted light from a light source. As examples, precursor blocking layer 116 may include a metal (e.g., copper (Cu) or aluminum (Al)), and in further examples discussed herein, may include nitride-based materials or other non-metal substances. In the example of FIG. 3, precursor blocking layer 116 may be deposited as a single metal layer on oxide layer 112 and/or nitride layer 114.

Although precursor blocking layer 116 may be initially formed as a single layer of material on oxide layer 112 and/or nitride layer 114, targeted portions of precursor blocking layer 116 may be removed to form multiple blocking layers. As shown in FIG. 3, a second mask 118 may be formed on precursor blocking layer 116. Second mask 118 may have an opening G which is substantially aligned with confinement structure 110, and may have a horizontal width that is at most equal to that of confinement structure 110. Second mask 118 may include one or more of the materials discussed elsewhere herein regarding first mask 108, or may include any other currently known or later developed masking material.

Figure 4:
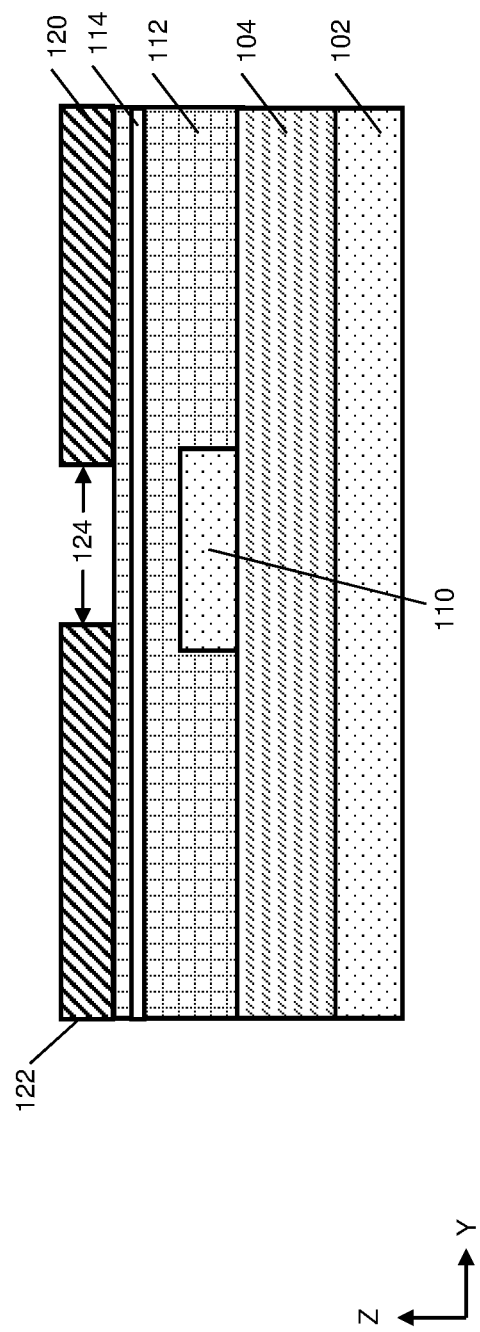
FIG. 4 shows a cross-sectional view of a process to form a first blocking layer and a second blocking layer with a horizontal slot therebetween according to embodiments of the disclosure.

Referring to FIG. 4, second mask 118 (FIG. 3) may be used to separate precursor blocking layer 116 (FIG. 3) into multiple blocking layers. With second mask 118 in place, exposed material of precursor blocking layer 116 may be removed (e.g., by etching) to form a first blocking layer 120 and a second blocking layer 122 on opposite horizontal ends of a horizontal slot 124. Second mask 118 may thereafter be removed, e.g., by stripping or other currently known or later developed processes for removing masking material from a structure. Horizontal slot 124 may have substantially the same horizontal width as opening G (FIG. 3) within second mask 118. The resulting first blocking layer 120 and second blocking layer 122 thus may be formed from the same material, and/or each may have a horizontal end positioned partially over confinement structure 110. Horizontal slot 124 may be sized to accommodate various gain media as discussed elsewhere herein. In further embodiments discussed herein, second mask 118 may additionally or alternatively be used to replace portions of precursor blocking layer 116 (FIG. 3) with other blocking layer materials, e.g., one or more nitride compounds.

Figure 5:
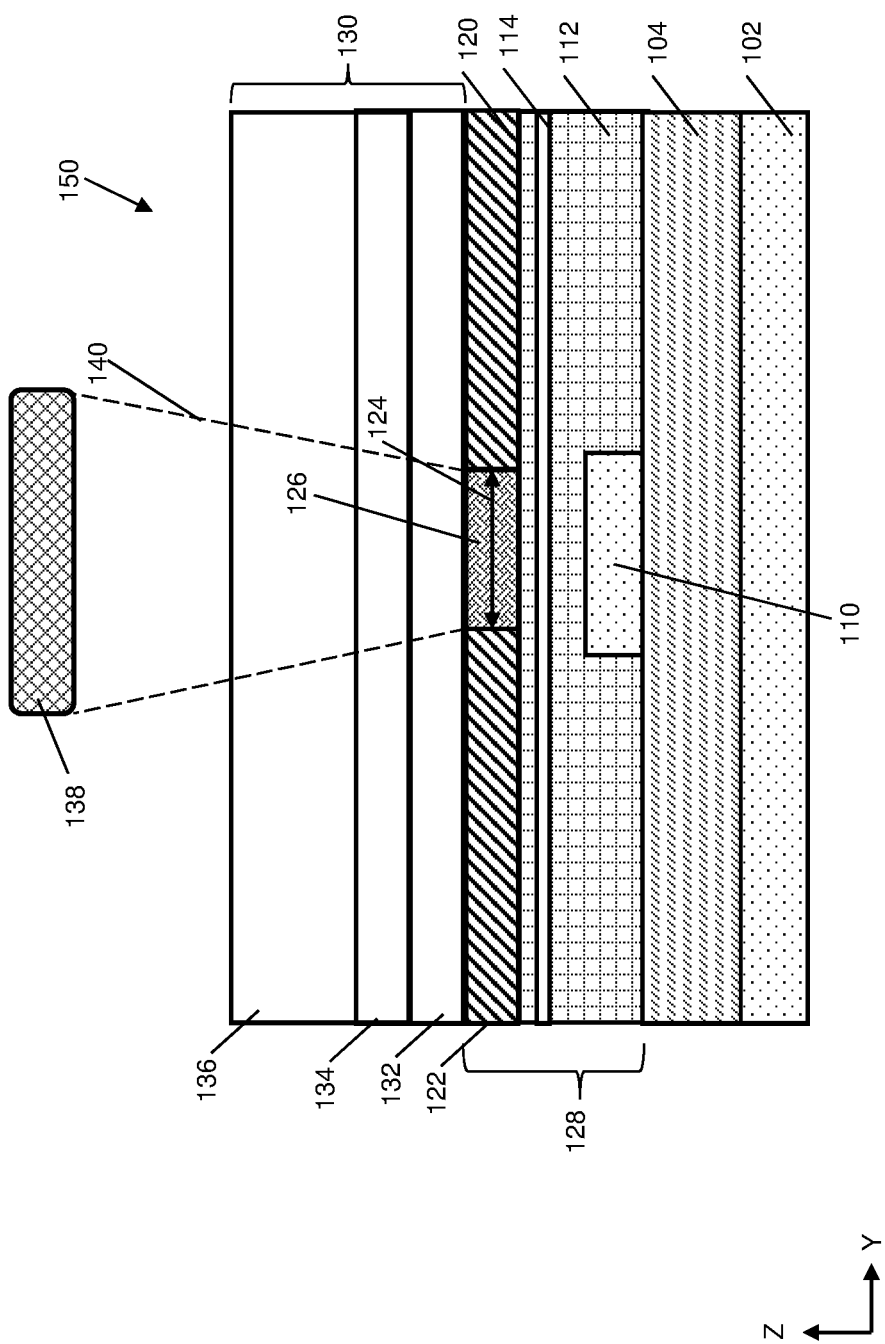
FIG. 5 shows a cross-sectional view of a process to form a gain medium, back-end-of-line (BEOL) stack, and light source according to embodiments of the disclosure.

Turning to FIG. 5, continued processing according to the disclosure may include forming a gain medium 126 within horizontal slot 124 (FIG. 4), and over oxide layer 112 and/or nitride layer 114 where applicable. Gain medium 126 may be formed by a combination of deposition and planarization, such that gain medium 126 is equal in thickness to first blocking layer 120 and second blocking layer 122. Thus, gain medium 126 may feature an upper surface that is substantially coplanar with the upper surfaces of blocking layers 120, 122 and a lower surface that is substantially coplanar with the lower surfaces of blocking layers 120, 122. Gain medium 126 may be formed to have a different thickness in further embodiments, as discussed elsewhere herein. Gain medium 126 may take the form of any currently known or later developed gain medium for producing an optically pumped laser, e.g., various doped oxide materials. In an example implementation, gain medium 126 may be an oxide material with various dopants configured to absorb energy to output light to confinement structure 110. According to an example, gain medium 126 may include aluminum oxide ($Al_2O_3$) doped with a rare earth metal, e.g., erbium (Er). Due to the size of horizontal slot 124, gain medium 126 may have a horizontal width that is at most equal to the horizontal width of confinement structure 110. At this stage, confinement structure 110, blocking layers 120, 122, and gain medium 126 together may form a waveguide-confining layer 128. Light transmitted to gain medium 126 may cause gain medium 126 to produce laser light, which may be confined in confinement structure 110. The confined light may be relayed via confinement structure 110 to a waveguide material to produce sub-wavelength laser beams (e.g., beams of a radius of approximately three-hundred nm) due to the light-confining effects of confinement structure 110 and blocking layers 120, 122 at their respective positions.

Continued processing according to the disclosure may include forming additional components on waveguide-confining layer 128. For example, as shown in FIG. 5, methods according to the disclosure may include forming a back-end-of-line (BEOL) stack 130 over waveguide-confining layer 128. BEOL stack 130 may include several distinct layers, each of which may be structured to include metal wires and/or vias of a device, in addition to other materials discussed herein. For the sake of example, BEOL stack 130 is illustrated as including a first layer 132, a second layer 134, and a third layer 136, though it is understood that many devices will have as many as five, ten, fifteen, twenty, or more metal layers.

A light source 138 may be positioned above BEOL stack 130 and in optical communication with waveguide-confining layer 128. Light source 138 may include, e.g., a laser, light emitting diode (LED), or other light-emitting device operable to optically pump gain medium 126. The properties of light emitted from light source 138 may vary from application to application, so long as the transmitted light energy remains operable to produce laser beams via gain medium 126. In embodiments where multiple layers of BEOL stack 130 separate light source 138 from gain medium 126, a pathway 140 (e.g., at least partially translucent portions of BEOL stack 130) may optically connect light source 138 to gain medium 126. In any case, waveguide-confining layer 128 and BEOL stack 130, along with other components discussed herein, may form a PIC die 150 operable to send and receive photonic signals using light source 138 and gain medium 126.

Figure 6:
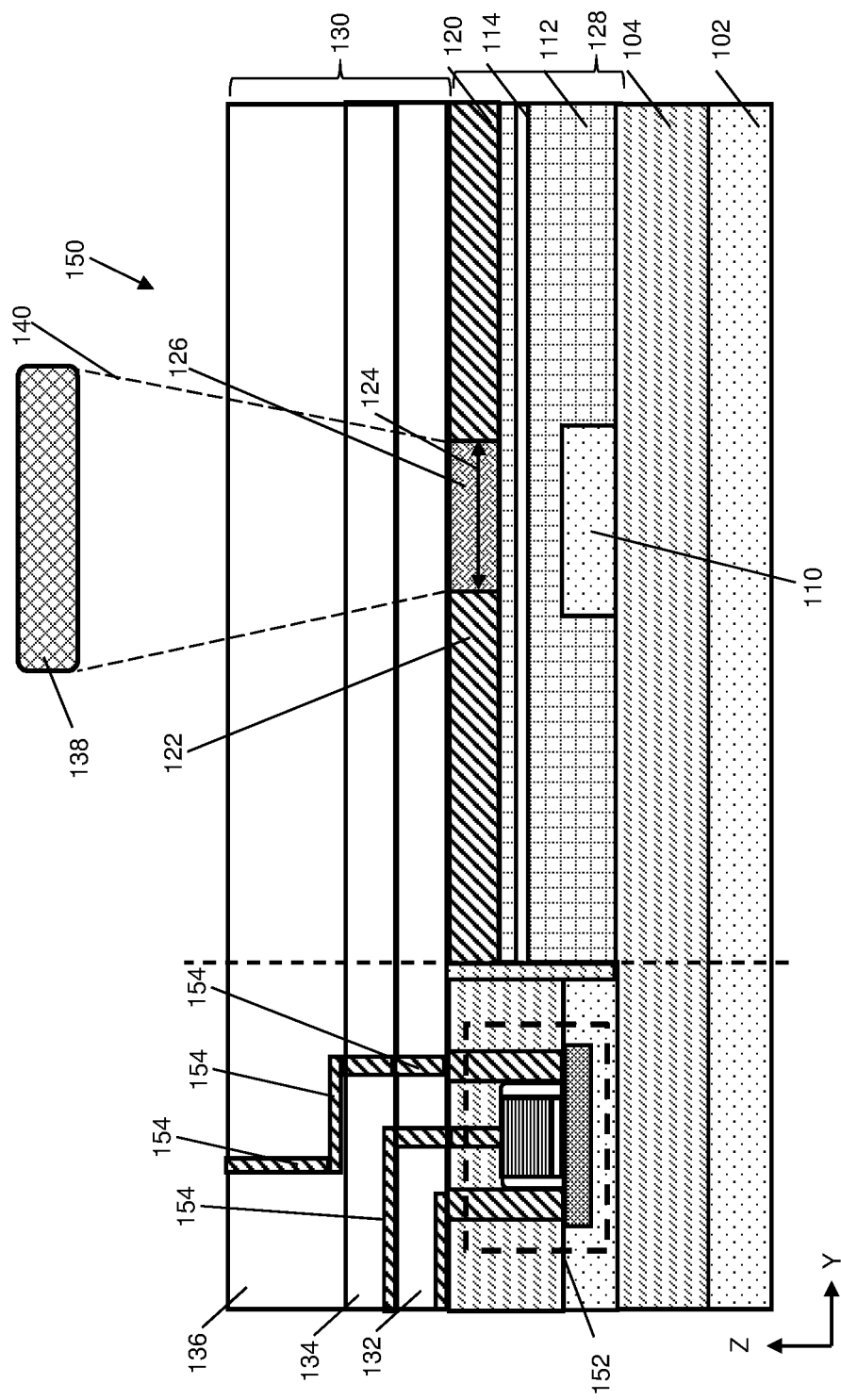
FIG. 6 shows a cross-sectional view of a photonic integrated circuit (PIC) die with a waveguide-confining layer adjacent a device according to embodiments of the disclosure.

Turning to FIG. 6, an advantage of forming waveguide-confining layer 128 in PIC die 150 is its ease of integration with other structures. For example, waveguide-confining layer 128 may be horizontally aligned with, or may form part of, a device layer where one or more transistors 152 are formed over substrate 102 and buried insulator layer 104. PIC die 150 thus may include transistor 152, indicated with a phantom border, over buried insulator layer 104. Buried insulator layer 104 may separate transistor 152 from substrate 102. Transistor 152 may take the form of a three-terminal transistor according to any one of several device architectures. Transistor 152 is shown for the purposes of example as being a planar FET, but it is understood that various embodiments of the disclosure may also include transistors in the form of fin-type FETs ("FinFETs"), nanosheet transistors, vertically-oriented FET(s) ("VFETs"), bipolar junction transistors ("BJTs") and/or any other currently known or later developed transistor architecture. Although transistor 152 is omitted from the partial cross-sectional view of PIC die 150 in FIG. 5 and other FIGS. discussed herein, this is solely for ease of illustration and transistor 152 may appear in a similar location regardless of how PIC die 150 is embodied.

PIC die 150 may include a set of metal levels and vias (collectively "conduction paths") 154 therein. Each conduction path 154 may generally include one or more electrically conductive materials formed within BEOL stack 130 provide an interconnect scheme, e.g., to electrical connections between various device structures and/or to other components such as external structures or devices. Each conduction path 154 may be used to interconnect circuit elements of PIC die 150, e.g., multiple transistors and/or other elements via multiple conduction paths 154 and/or other components. Conduction path(s) 154 may be formed of copper or other metals suitable for serving as a conductive wire in an IC structure. In the case of a via, conduction path(s) 154 may also include substantially annular refractory metal liners (not shown) disposed circumferentially about the metal(s) therein structure for providing additional electrical insulation and for preventing electromigration between conduction path(s) 154 and adjacent semiconductor regions in PIC die 150. Such liners may be composed of any currently known or later developed conductive material, e.g., refractory metals such as ruthenium (Ru), tantalum (Ta), titanium (Ti), tungsten (W), iridium (Jr), rhodium (Rh) and platinum (Pt), etc., or mixtures of thereof.

Figure 7:
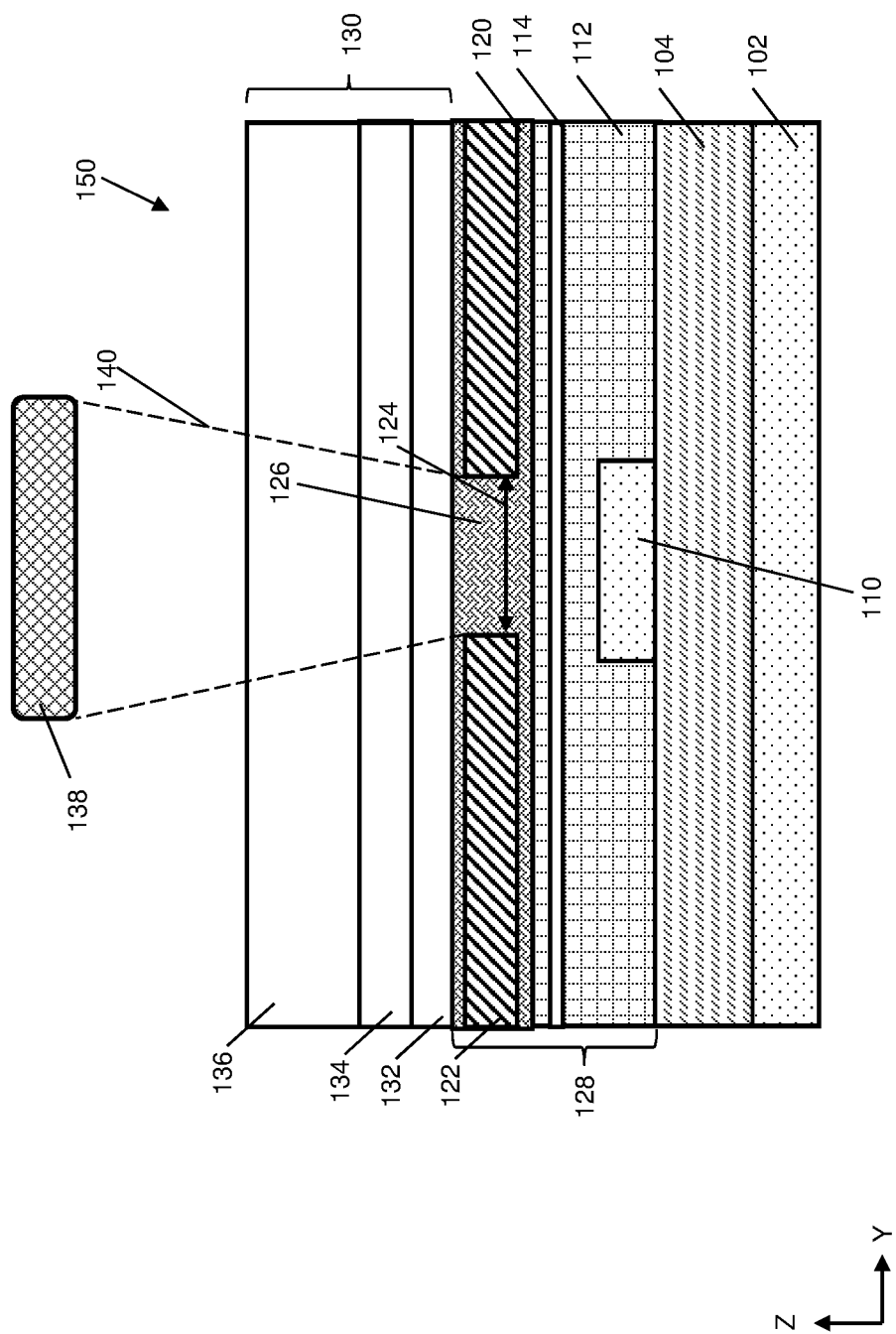
FIG. 7 shows a cross-sectional view of a PIC die with a gain medium having a greater horizontal thickness than the first blocking layer and the second blocking layer according to embodiments of the disclosure.

Turning to FIG. 7, waveguide-confining layer 128 may be modified to include various alternative configurations and/or additional components while maintaining its ability to produce sub-wavelength laser beams from gain medium 126. According to one example, first blocking layer 120 and second blocking layer 122 may be embedded within gain medium 126 without having the same thickness as gain medium 126. In this case, first blocking layer 120 and second blocking layer 122 may be formed, e.g., by forming gain medium 126 on oxide layer 112 and/or nitride layer 114 without first forming precursor blocking layer 116 (FIG. 3). In this case, portions of gain medium 126 may be removed and replaced with first blocking layer 120 and second blocking layer 122, and further processing optionally may include covering blocking layers 120, 122 with additional gain medium 126 material. However, waveguide-confining layer 128 may remain capable of outputting lasers of a sub-wavelength diameter so long as at least a portion of gain medium 126 is positioned horizontally between first blocking layer 120 and second blocking layer 122, and vertically confinement structure 110 and light source 138.

Figure 8:
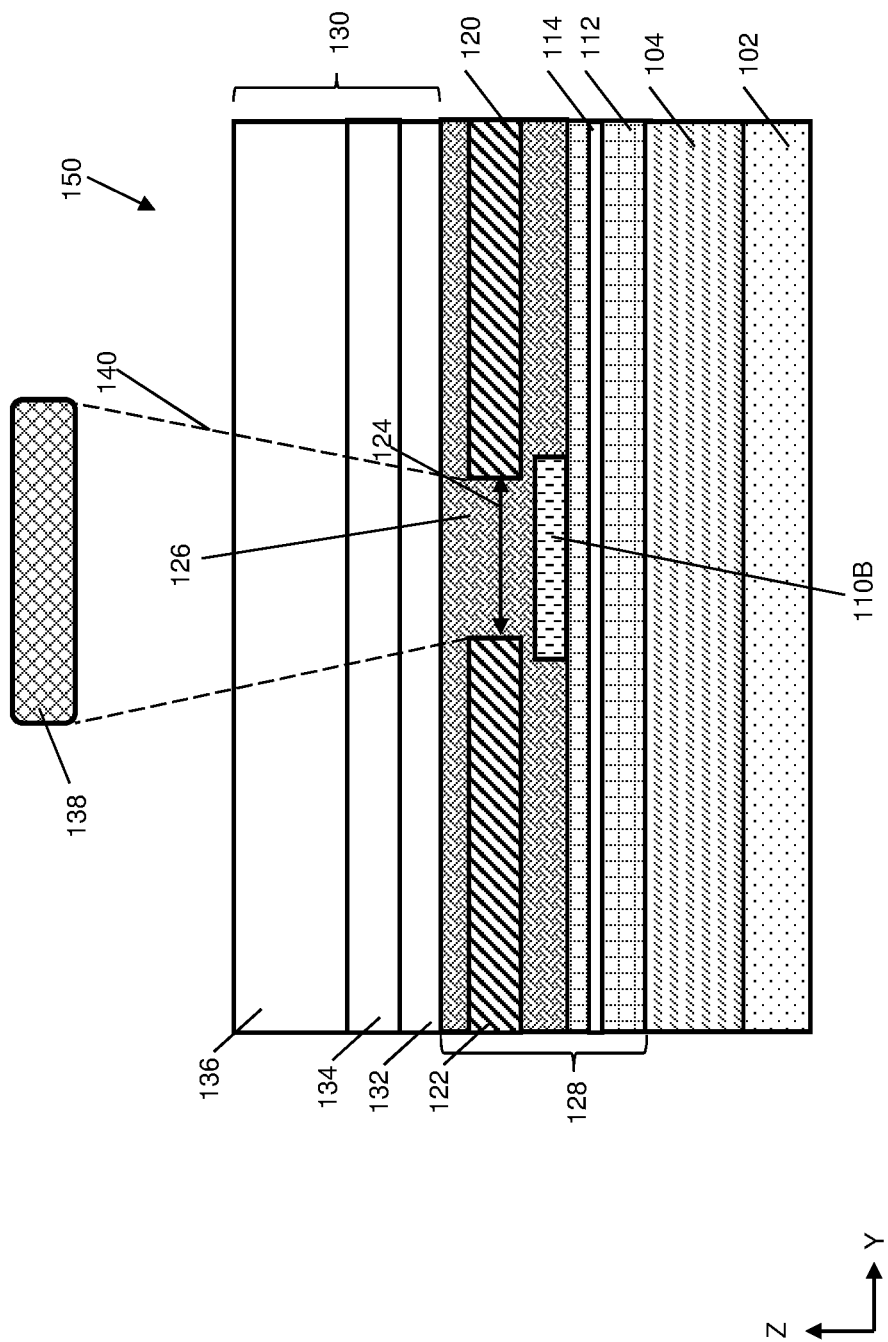
FIG. 8 shows a cross-sectional view of a PIC die with a silicon-based optical confinement structure within the gain medium according to embodiments of the disclosure.
Figure 9:
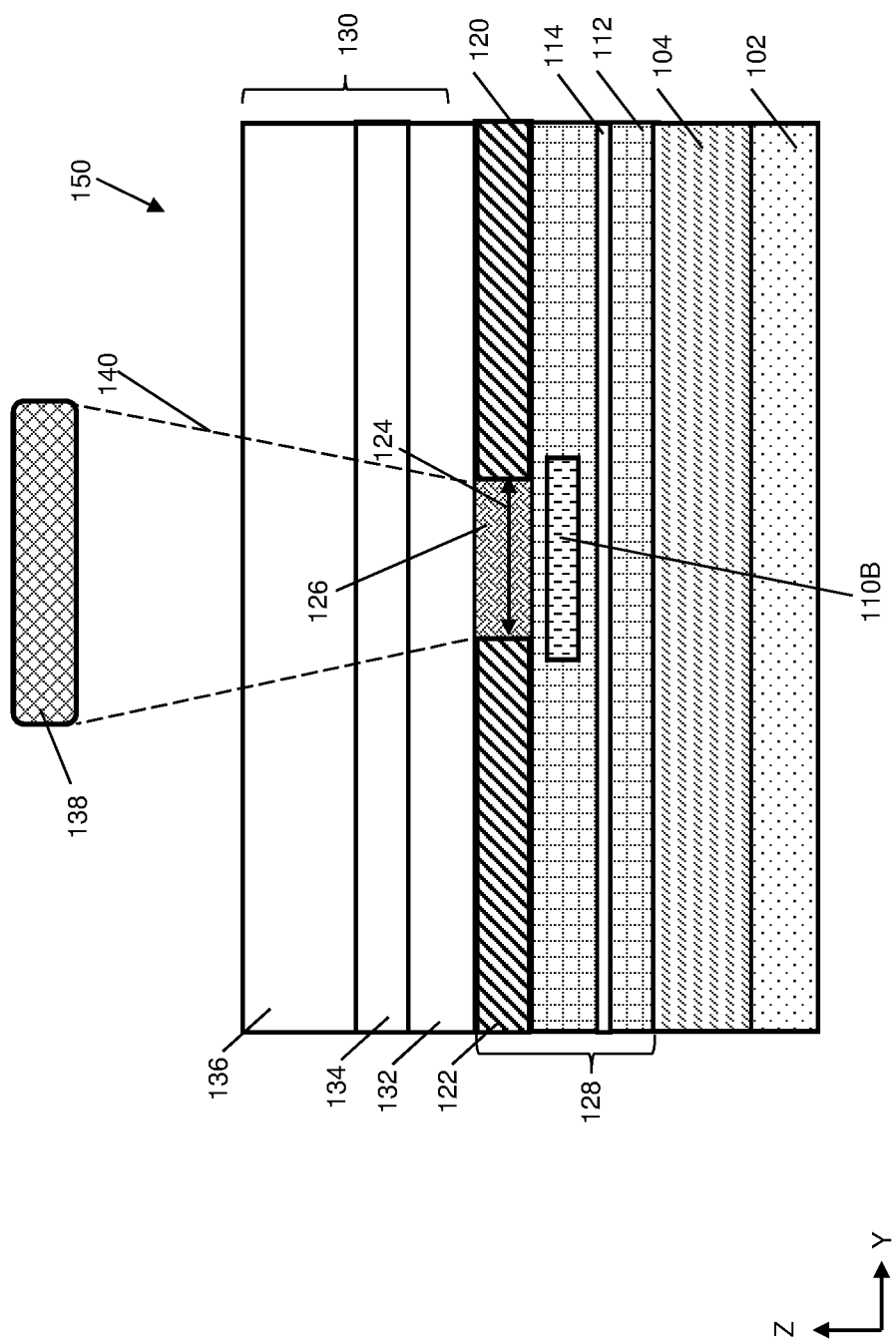
FIG. 9 shows a cross-sectional view of a PIC die with a silicon-based optical confinement structure formed of silicon nitride (SiN) according to embodiments of the disclosure.

Turning to FIGS. 8 and 9, further embodiments of waveguide-confining layer 128 and PIC die 150 may include alternative materials for horizontal confinement of light within gain medium 126. Specifically, confinement structure 110 (FIGS. 1-7) may be embodied as a silicon nitride optical confinement structure (simply "confinement structure" hereafter) 110B positioned on oxide layer 112 (FIG. 8) or embedded within oxide layer 112 (FIG. 9). Although confinement structure 110B remains silicon-based in these examples, the further inclusion of nitride ions in confinement structure 110B may increase the refractive index of confinement structure 110B as compared to embodiments without nitride. As a result, confinement structure 110B may be positioned closer to gain medium 126 than confinement structures 110 which lack nitride ions. Where applicable, confinement structure 110B may be positioned vertically above nitride layer 114, with confinement structure 110B and nitride layer 114 cooperating to further confine lasers in gain medium 126. Notwithstanding these additional or alternative features, the silicon particles of confinement structure 110B may continue to operate as noted in other examples, e.g., confining the size of optically pumped lasers in gain medium 126 by having a high refractive index (i.e., refractive index greater than 1.5). As is also shown in FIGS. 8 and 9, the vertical thickness of gain medium 126 may vary based on the position of confinement structure 110B, e.g., being thicker than first blocking layer 120 and second blocking layer 122 (FIG. 8), or equal to the thickness of first and second blocking layers (FIG. 9). The composition of confinement structure 110, 110B, and/or other materials described herein, may be based on the type of lasers to be emitted, the type of waveguide material used, or other technical factors.

Figure 10:
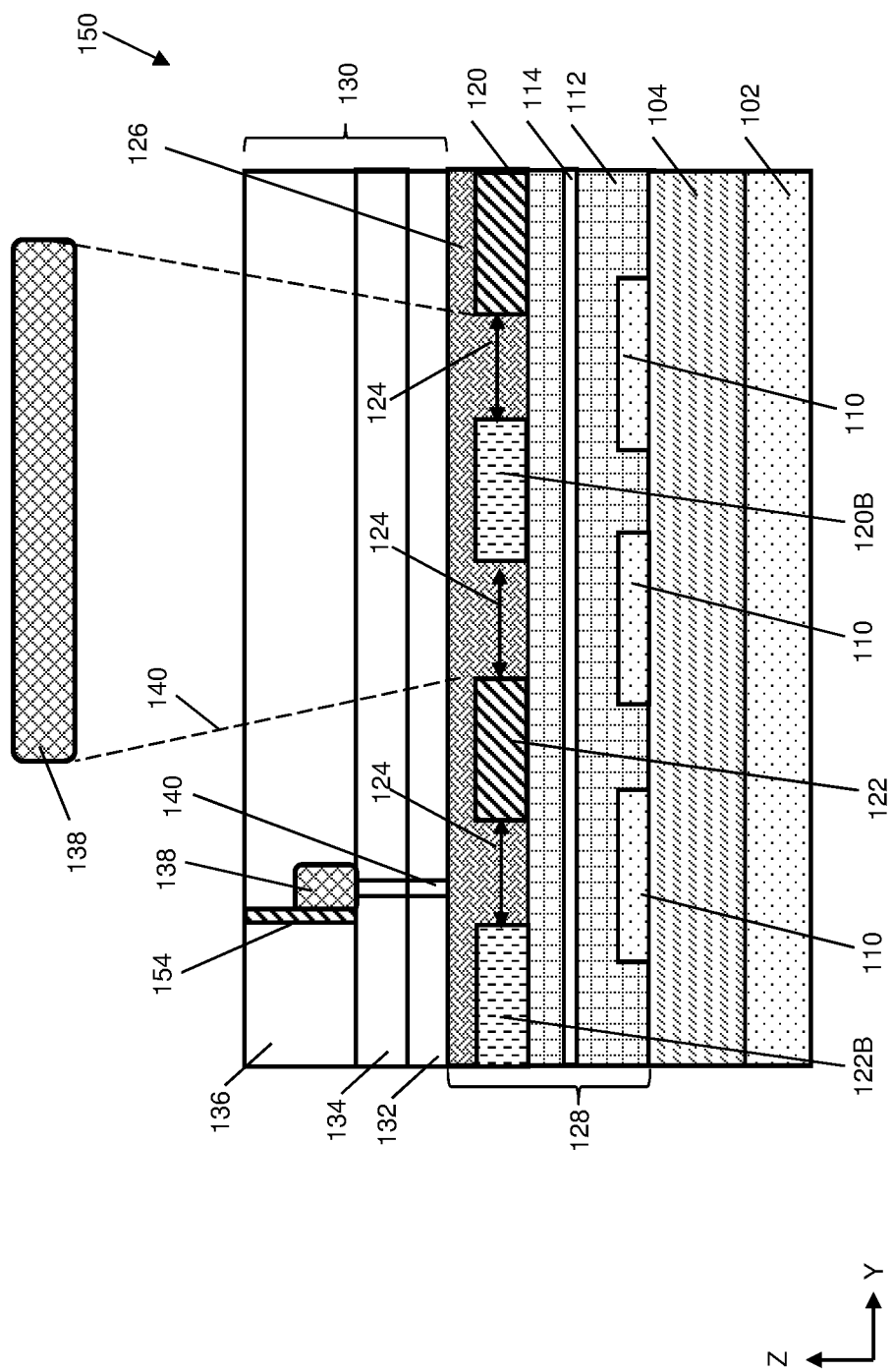
FIG. 10 shows a cross-sectional view of multiple silicon-based optical confinement structures, and blocking layers of varying composition, according to embodiments of the disclosure.

Referring to FIG. 10, embodiments of the disclosure may include multiple blocking layers 120, 122 and/or blocking layers 120, 122 formed of non-metal substances. FIG. 10 depicts waveguide-confining layer 128 of PIC die 150 with first blocking layer 120 and second blocking layer 122 formed of metal together with first and second non-metal blocking layers 120B, 122B which cooperate to form three horizontal slots 124 with gain medium 126 therein. Non-metal blocking layers 120B, 122B may be formed of any material having a high refractive index (i.e., refractive index of 1.5 or greater). As examples, non-metal blocking layers 120B, 122B may include one or more silicon based materials such as those suitable for confinement structure(s) 110, 110B (FIGS. 9, 10), e.g., crystalline silicon, silicon nitride (SiN), etc.

Each blocking layer 120, 122 may be positioned adjacent a corresponding non-metal blocking layer 120B, 122B to allow optical pumping gain medium 126 at multiple locations. In an example, multiple light sources 138 may be vertically aligned with at least one of several horizontal slots 124, thereby allowing multiple sub-wavelength scale lasers to be optically pumped within a single waveguide confining layer 128. This arrangement may further include, e.g., multiple confinement structures 110 within oxide layer 122, each of which may be vertically aligned with one horizontal slot 124 between blocking layers 120, 120B, 122, 122B. In some cases, as shown by example in FIG. 10, one or more light sources 138 may be formed within BEOL stack 130 and may be connected to other elements of PIC die 150 through conduction path(s) 154. In this case, BEOL stack 130 may include pathway(s) 140 therein for optically connecting light source(s) 138 to gain medium 126.

Figure 11:
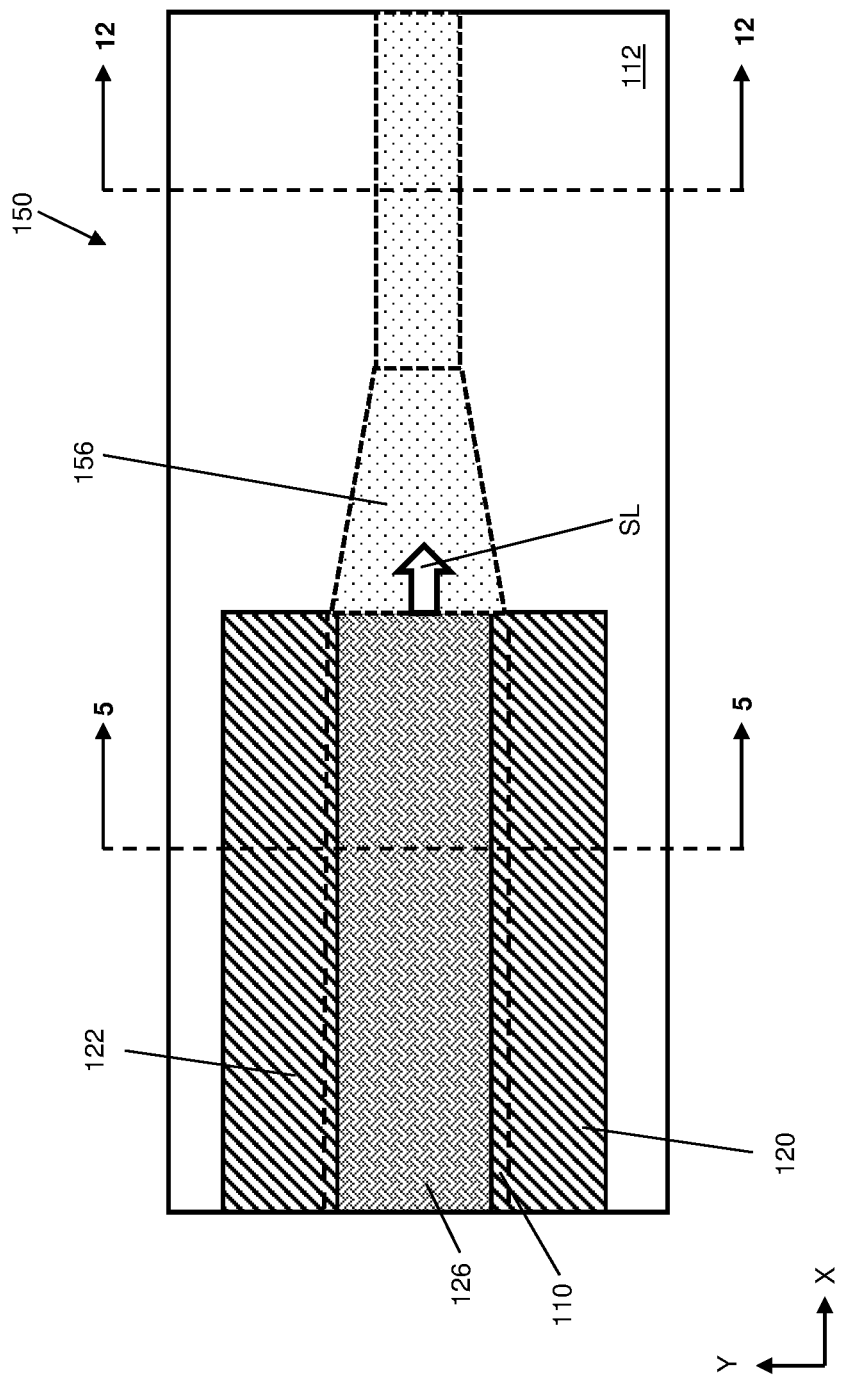
FIG. 11 shows a plan view of a gain medium of a waveguide-confining layer coupled to a waveguide according to embodiments of the disclosure, with reference lines for cross-sectional views depicted in FIG. 5 and FIG. 12.
Figure 12:
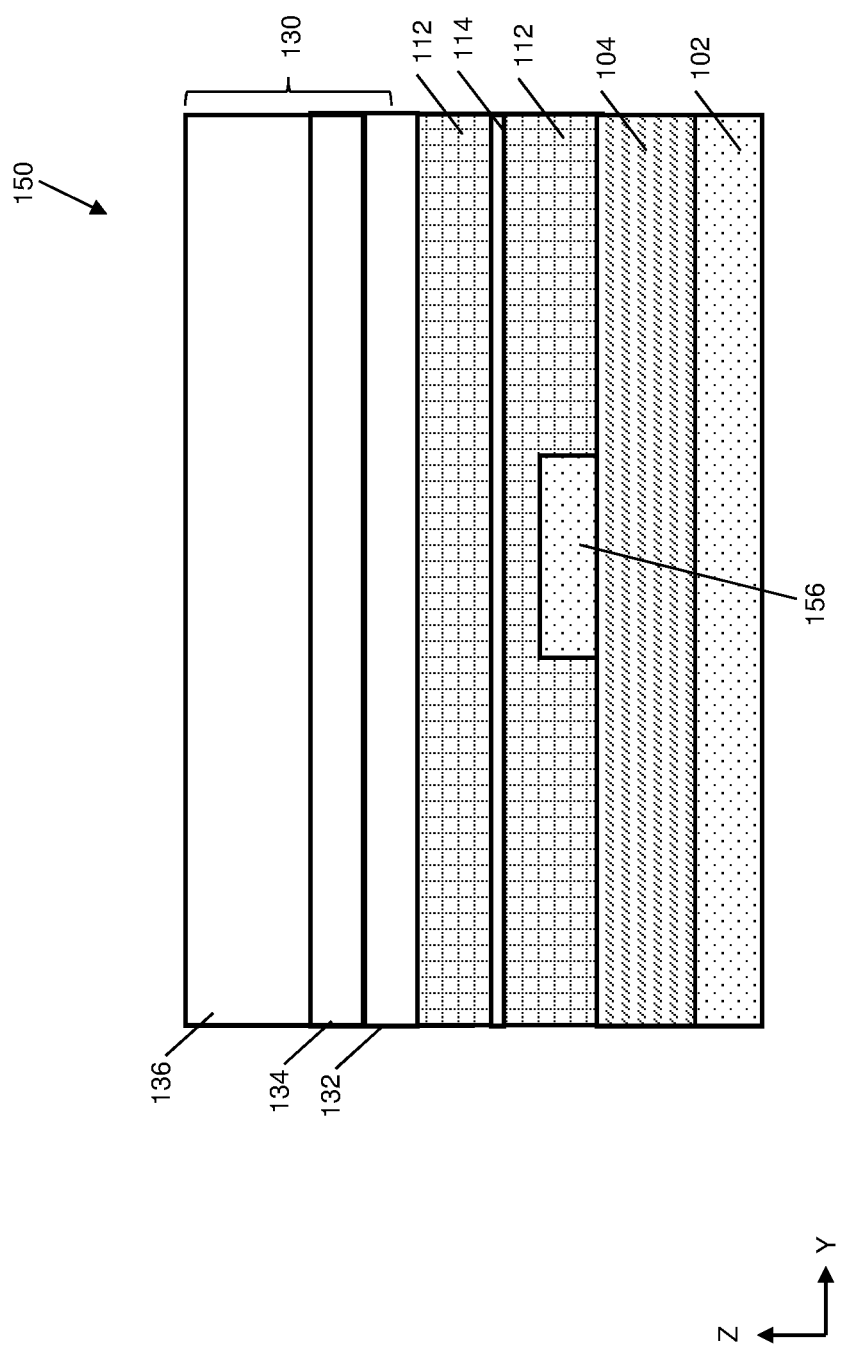
FIG. 12 shows a cross-sectional view along line 12-12 of FIG. 11 of a silicon-based optical confinement structure and waveguide according to embodiments of the disclosure.

Referring to FIGS. 5, 11, and 12 together, embodiments of the disclosure may include the coupling of a waveguide 156 to gain medium 126 to transmit optical signals between PIC die 150 and other devices or components. FIG. 11 provides a plan view of a portion of PIC die 150 in plane X-Y, while FIGS. 5 and 12 provide two-dimensional cross-sectional view of PIC die 150 along view lines 5-5 and 12-12 indicated in FIG. 11. It is emphasized that the portion of PIC die 150 shown in FIG. 11 represents only a portion of the complete PIC die 150 structure, and several device structures are omitted from FIG. 11 for clarity of illustration. FIGS. 11 and 12 illustrate a waveguide 156 contacting and thus coupled to confinement structure 110 (shown in phantom). When gain medium 126 is optically pumped during operation of PIC die 150, the laser light produced in gain medium 126 may enter confinement structure 110 and may then pass to waveguide 156 for transmission to other devices and/or components. The direction of travel from confinement structure 110 to waveguide 156 is indicated by arrow SL. Although a single waveguide 156 is shown in the non-limiting example, it is understood that PIC die 150 may include multiple waveguides. As such, the number of waveguides 156 included in PIC die 150 are illustrative, and may be dependent at least in part on the function, purpose, and/or desired operation for PIC die 150.

Waveguide 156 may take the form of at least one optical fiber. In this case, waveguide 156 may be housed at least partially within oxide layer 112 as shown in FIGS. 11 and 12, and oxide layer 112 may include a groove or other structure for coupling or housing of waveguide 156 within oxide layer 112. In any case, waveguide 156 may be sized and/or may include a shape/configuration that may ensure the meeting/contacting between waveguide 156 and confinement structure 110, and/or alignment of waveguide 156 with confinement structure 110. In the non-limiting example shown in FIG. 12, waveguide 156 may be embedded within oxide layer 112. In other non-limiting examples (not shown), waveguide 156 may be sized such that at least a portion of waveguide 156 is positioned above an upper surface of oxide layer 112.

Waveguide 156 may be formed as any suitable optical element or structure that is configured to transmit and/or receive optical information signals produced in gain medium 126. In a non-limiting example, waveguide 156 may include a core layer (not shown) formed from crystalline silicon, or other similar materials. In further examples, waveguide 156 may include a silicon, silica, or silica doped material. In still further examples, waveguide 156 may include multicore core fibers for optical coupling to gain medium 126, other waveguides 156, and/or other components. In other non-limiting examples (not shown) waveguide 156 may also include a cladding layer and/or insulating jacket surrounding its core layer. In other non-limiting examples, waveguide 156 may be formed as one or more fluoride fibers, chalcogenide fibers, and/or plastic fibers. As shown specifically in FIG. 12, waveguide 156 may extend transversely from, confinement structure 110 to transmit signals from PIC die 150.

Figure 13:
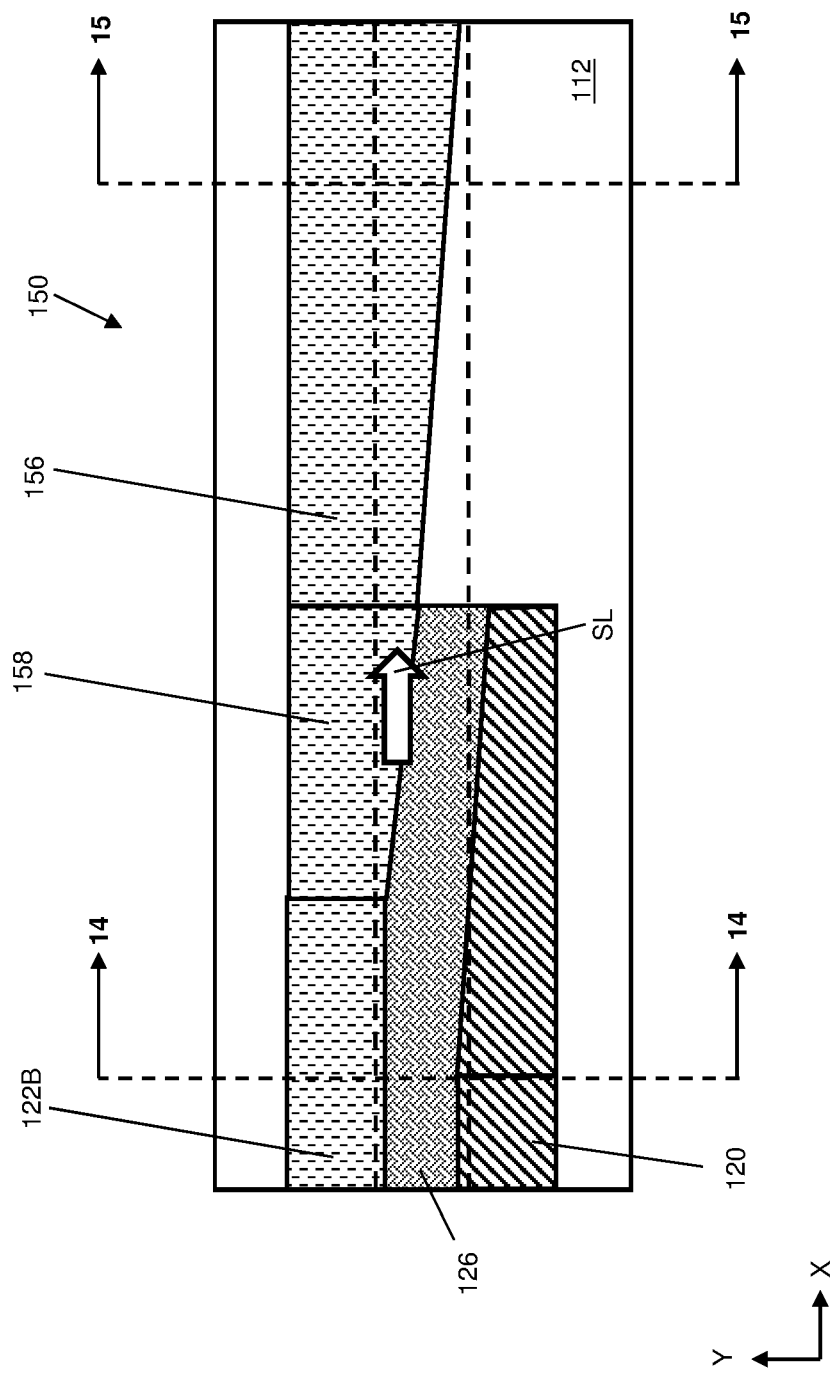
FIG. 13 shows a plan view of a gain medium of a waveguide-confining layer coupled to a silicon nitride (SiN) waveguide according to further embodiments of the disclosure, with reference lines for cross-sectional views depicted in FIG. 14 and FIG. 15.
Figure 14:
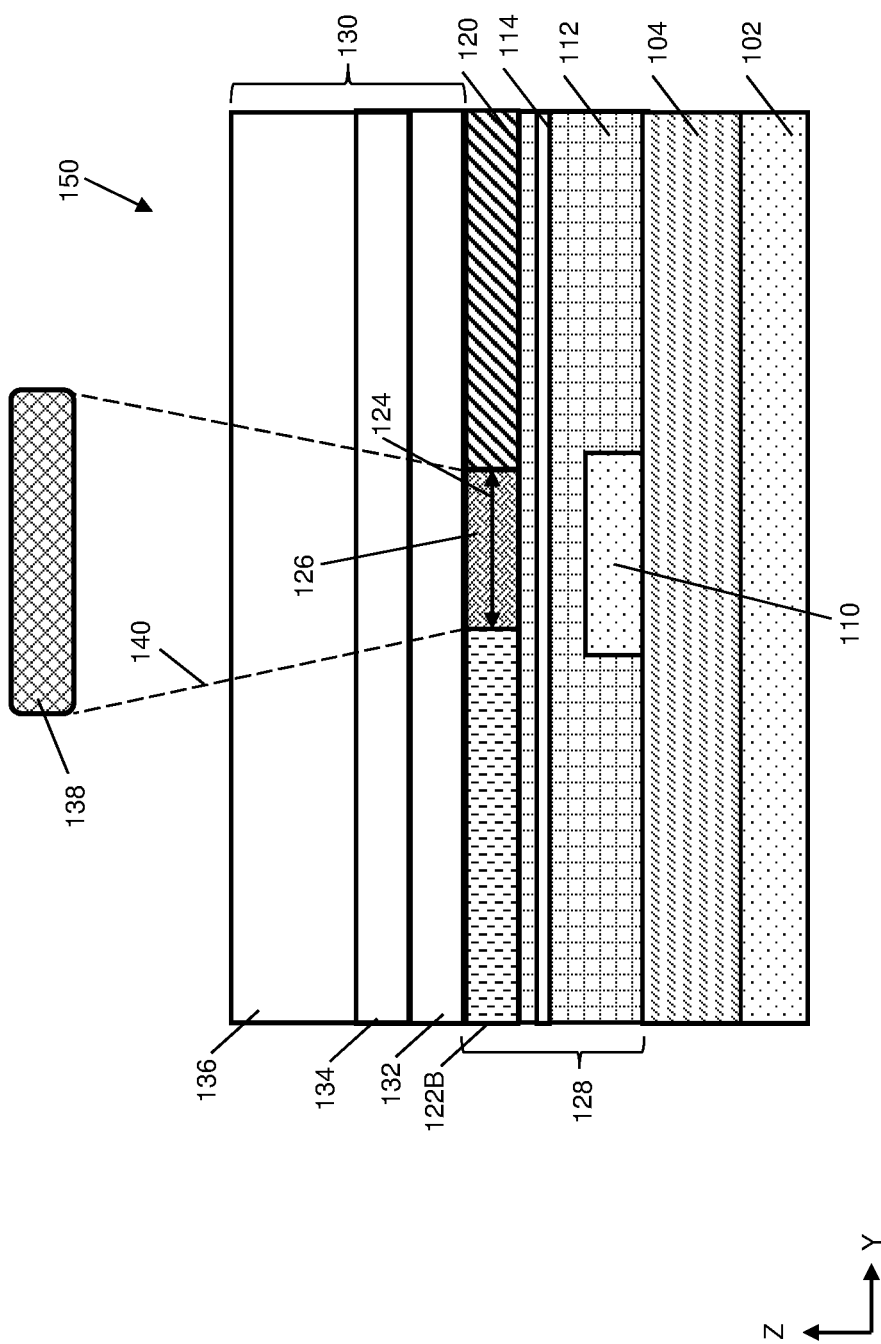
FIG. 14 shows a first cross-sectional view along line 14-14 of FIG. 13 of a waveguide-confining layer with SiN and copper blocking layer materials according to embodiments of the disclosure.
Figure 15:
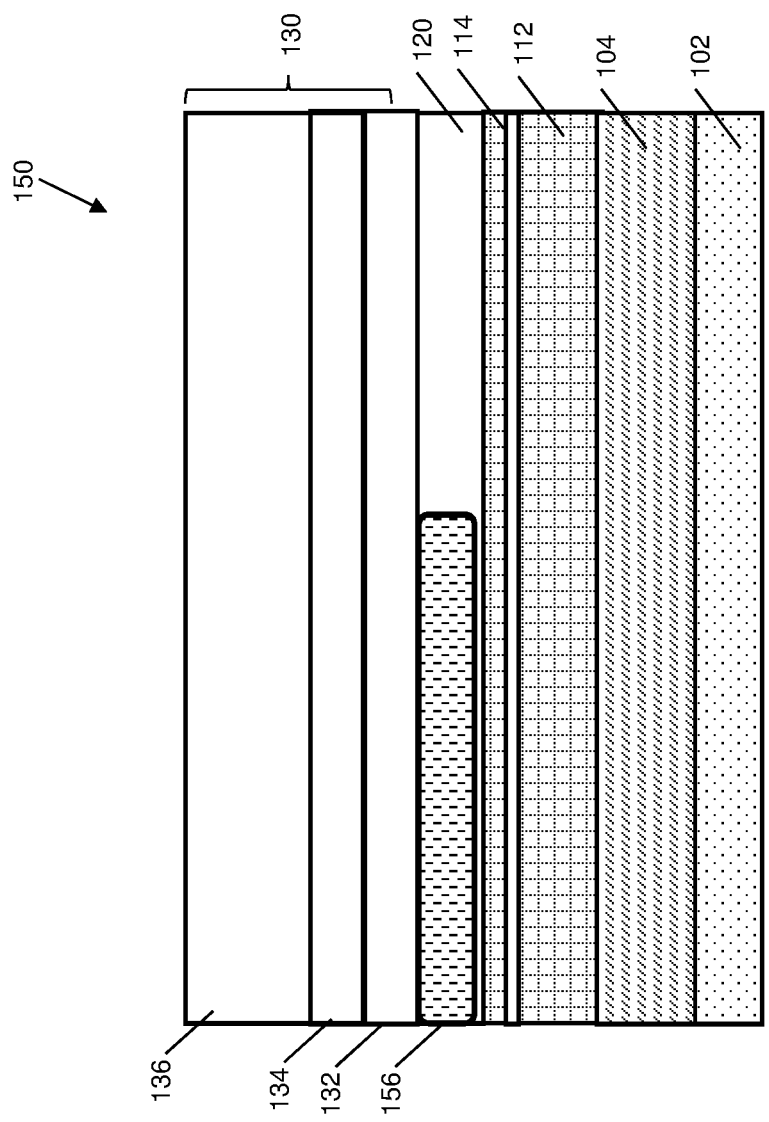
FIG. 15 shows a second cross-sectional view along line 15-15 of FIG. 13 of the SiN waveguide within the PIC die according to embodiments of the disclosure.

Referring now to FIGS. 13-15, embodiments of the disclosure may be operable for use with further waveguide configurations, e.g., hybrid dielectric-plasmonic waveguide structures. FIG. 13 provides a partial plan view of PIC die 150 in plane X-Y, with FIGS. 14 and 15 providing cross-sectional views of PIC die 150 in plane Y-Z along lines 14-14 and 15-15, respectively. In a hybrid dielectric-plasmonic waveguide structure, various non-dielectric materials may be included together with dielectric materials in waveguide-confining layer 128 and the structure of waveguide 156 to confine light within gain medium 126 and waveguide 156.

According to an example, first blocking layer 120 may include a metal while second non-metal blocking layer 122B may also be provided within waveguide-confining layer 128. In this case, the material composition of blocking layer 122B may also be used to form waveguide 156. As shown in FIG. 13, gain medium 126 may form a physical interface with a coupling region 158 located between blocking layer 122B and waveguide 156. Blocking layer 122B, waveguide 156, and coupling region 158 may have a same or similar material composition (e.g., SiN, other silicon-based materials, and/or silicon-based dielectric materials). In this case, light output from gain medium 126 may enter the dielectric material of waveguide 156 by passing through coupling region 158. The direction of travel from gain medium to waveguide 156 through coupling region 158 is indicated by arrow SL. In this scenario, confinement structure 110 (FIGS. 2-10, 12, 14) may not be present in waveguide-confining layer 128 beneath waveguide 156 as shown in FIG. 15.

Embodiments of the disclosure may provide several technical and commercial advantages, some of which here discussed herein by way of example. As noted herein with respect to various embodiments, waveguide-confining layer 128 may be operable to produce laser beams at a sub-wavelength scale (i.e., beams having a radius that is less than the wavelength of the emitted light). Confinement structure (s) 110, 110B, blocking layer(s) 120, 120B, 122, 122B, and the composition of gain medium 126 in waveguide-confining layer 128 cooperate to ensure that sub-wavelength beams are produced in gain medium 126 without additional refraction materials being required in BEOL stack 130. As a result, embodiments of waveguide-confining layer 128 may be easily integrated into PIC die 150 without requiring further components in BEOL stack 130 or elsewhere. The example material compositions of waveguide-confining layer 128 may easily be easily detectable to further aid the coupling of waveguides 154 thereto, and a variety of waveguide 156 compositions may be operable for use with waveguide-confining layer 128 and PIC die 150.

The descriptions of the various embodiments of the present invention have been presented for purposes of illustration, to be exhaustive or limited to the embodiments disclosed. Many modifications and variations will be apparent to those of ordinary skill in the art without departing from the scope and spirit of the described embodiments The terminology used herein was chosen to best explain the principles of the embodiments, the practical application or technical improvement over technologies found in the marketplace, or to enable others of ordinary skill in the art to understand the embodiments disclosed herein.

What is claimed is:

1. A waveguide-confining layer for a photonic integrated circuit (PIC) die, the waveguide-confining layer comprising:
   an oxide layer over a buried insulator layer;
   a silicon-based optical confinement structure embedded within or positioned on the oxide layer;
   a first blocking layer and a second blocking layer over the oxide layer and separated from each other by a horizontal slot, wherein each of the first blocking layer and the second blocking layer includes a metal or a nitride;
   a gain medium on the oxide layer and within the horizontal slot between the first blocking layer and the second blocking layer, the gain medium including a material having a lower refractive index than each of the first blocking layer and the second blocking layer, wherein the gain medium is vertically aligned with the silicon-based optical confinement structure, and a portion of the oxide layer separates the gain medium from the silicon-based optical confinement structure,
   wherein an upper surface of the gain medium is substantially coplanar with an upper surface of each of the first blocking layer and the second blocking layer, and a lower surface of the gain medium is substantially coplanar with a lower surface of each of the first blocking layer and the second blocking layer; and
   a nitride layer within the oxide layer, the nitride layer positioned vertically between the gain medium and the silicon-based optical confinement structure.

2. The waveguide-confining layer of claim 1, wherein the silicon-based optical confinement structure includes crystalline silicon (Si) or a nitride.

3. The waveguide-confining layer of claim 1, wherein each of the first blocking layer and the second blocking layer includes copper (Cu) or aluminum (Al), and the gain medium includes aluminum oxide ($Al_2O_3$) doped with a rare earth metal.

4. The waveguide-confining layer of claim 1, wherein the first blocking layer includes copper (Cu) or aluminum (Al), the second blocking layer includes the nitride, and the gain medium includes aluminum oxide ($Al_2O_3$) doped with a rare earth metal.

5. The waveguide-confining layer of claim 1, wherein a horizontal width of the silicon-based optical confinement structure is greater than a horizontal width of the horizontal slot between the first blocking layer and the second blocking layer.

6. A photonic integrated circuit (PIC) die comprising:
a semiconductor substrate;
a buried insulator layer on the semiconductor substrate;
an oxide layer over the buried insulator layer;
a silicon-based optical confinement structure embedded within or positioned on the oxide layer;
a first blocking layer and a second blocking layer over the oxide layer and separated from each other and separated by a horizontal slot, wherein each of the first blocking layer and the second blocking layer includes a metal or a nitride;
a gain medium on the oxide layer and within the horizontal slot between the first blocking layer and the second blocking layer, the gain medium including a material having a lower refractive index than each of the first blocking layer and the second blocking layer,
wherein the gain medium is vertically aligned with the silicon-based optical confinement structure, and a portion of the oxide layer separates the gain medium from the silicon-based optical confinement structure,
wherein an upper surface of the gain medium is substantially coplanar with an upper surface of each of the first blocking layer and the second blocking layer, and a lower surface of the gain medium is substantially coplanar with a lower surface of each of the first blocking layer and the second blocking layer;
a nitride layer within the oxide layer, the nitride layer positioned vertically between the gain medium and the silicon-based optical confinement structure;
a waveguide optically coupled to the silicon-based optical confinement structure; and
a back-end-of-line (BEOL) stack over the gain medium and the first blocking layer and the second blocking layer, wherein the BEOL stack includes a light source in optical alignment with the gain medium.

7. The PIC die of claim 6, wherein each of the first and second of blocking layers includes copper (Cu) or aluminum (Al), and the gain medium includes aluminum oxide ($Al_2O_3$) doped with a rare earth metal.

8. The PIC die of claim 6, wherein the first blocking layer includes copper (Cu) or aluminum (Al), the second blocking layer includes the nitride, and the gain medium includes aluminum oxide ($Al_2O_3$) doped with a rare earth metal.

9. The PIC die of claim 6, wherein the silicon-based optical confinement structure includes crystalline silicon (Si) or a nitride.

10. The PIC die of claim 6, wherein a horizontal width of the silicon-based optical confinement structure is greater than a horizontal width of the gain medium between the first blocking layer and the second blocking layer.

* * * * *